(12) United States Patent
Yeh et al.

(10) Patent No.: US 12,412,605 B2
(45) Date of Patent: *Sep. 9, 2025

(54) BIT LINE PRE-CHARGE CIRCUIT AND METHOD

(71) Applicant: TAIWAN SEMICONDUCTOR MANUFACTURING COMPANY LIMITED, Hsin-Chu (TW)

(72) Inventors: Che-Ju Yeh, Kaohsiung (TW); Yu-Hao Hsu, Tainan (TW); Hau-Tai Shieh, Hsinchu (TW); Cheng Lee, Hsinchu (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 496 days.

This patent is subject to a terminal disclaimer.

(21) Appl. No.: 17/893,601

(22) Filed: Aug. 23, 2022

(65) Prior Publication Data
US 2023/0053795 A1    Feb. 23, 2023

Related U.S. Application Data

(63) Continuation of application No. 17/331,718, filed on May 27, 2021, now Pat. No. 11,423,962.

(60) Provisional application No. 63/163,609, filed on Mar. 19, 2021.

(51) Int. Cl.
*G11C 7/12*    (2006.01)
*G11C 7/10*    (2006.01)
*G11C 7/22*    (2006.01)

(52) U.S. Cl.
CPC ............. *G11C 7/12* (2013.01); *G11C 7/1048* (2013.01); *G11C 7/1051* (2013.01); *G11C 7/1078* (2013.01); *G11C 7/222* (2013.01)

(58) Field of Classification Search
CPC ....... G11C 7/12; G11C 7/1048; G11C 7/1051; G11C 7/1078; G11C 7/222
USPC .................................................. 365/230.06
See application file for complete search history.

(56) References Cited

U.S. PATENT DOCUMENTS

| | | | |
|---|---|---|---|
| 11,423,962 B1* | 8/2022 | Yeh | ............... G11C 29/50012 |
| 2023/0100019 A1* | 3/2023 | Khawas | ............... H03K 3/0372 |
| | | | 327/225 |

* cited by examiner

*Primary Examiner* — Connie C Yoha
(74) *Attorney, Agent, or Firm* — Cooper Legal Group, LLC

(57) ABSTRACT

A bit line is pre-charged based on a clock signal internal to a bit line pre-charge circuit when a bit line pre-charge window is within a margin of a predetermined pre-charge window. A bit line is pre-charged based on a clock signal external to the bit line pre-charge circuit when the bit line pre-charge window is outside the margin of the predetermined pre-charge window.

20 Claims, 8 Drawing Sheets

BIT LINE PRE-CHARGE CIRCUIT AND METHOD

RELATED APPLICATIONS

This application is a continuation of U.S. Non-Provisional application Ser. No. 17/331,718, titled "BIT LINE PRE-CHARGE CIRCUIT AND METHOD" and filed on May 27, 2021, which claims priority to U.S. Provisional Application 63/163,609, titled "Apparatus for Clock-Based Bitline (BL) and Bitline Bar (BLB) Pre-Charging" and filed on Mar. 19, 2021. U.S. Non-Provisional application Ser. No. 17/331,718 and U.S. Provisional Application 63/163,609 are incorporated herein by reference.

BACKGROUND

Memory cell dies are formed by patterning a wafer. A single patterned wafer may contain thousands of memory cell dies. Memory cell dies are used in a multitude of electronic devices, such as mobile phones, laptops, desktops, tablets, watches, gaming systems, and various other industrial, commercial, and consumer electronics. Memory cells of a memory cell die may be arranged in a matrix. Each memory cell is accessed for memory read, write, and/or erase operations. Accessing a memory cell may include driving word lines and bit lines coupled to the memory cell to predetermined voltage(s).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
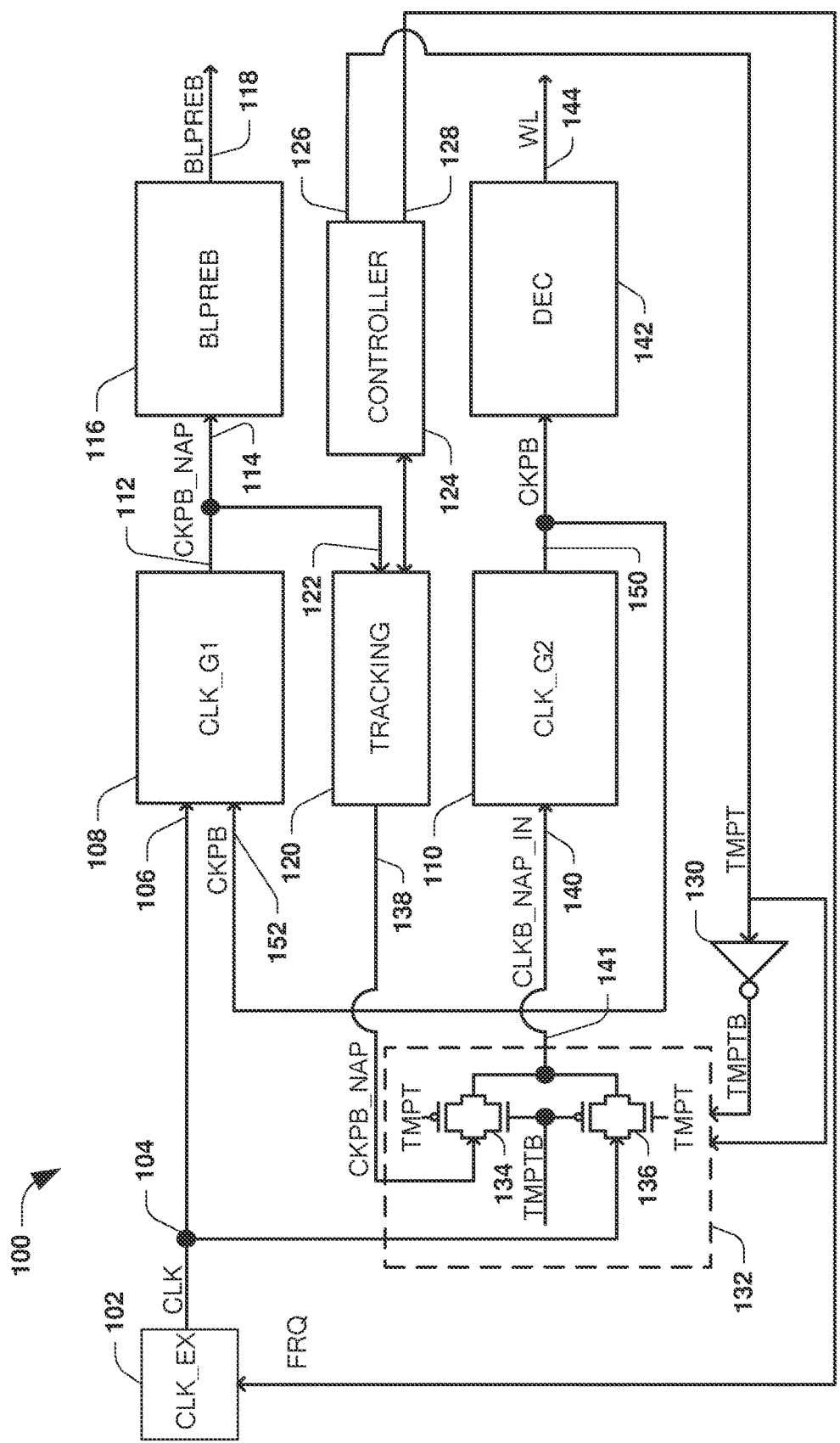
FIG. 1 is an illustration of a bit line pre-charge circuit, according to some embodiments.

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly. Also, relationship terms such as "connected to," "adjacent to," "coupled to," and the like, may be used herein to describe both direct and indirect relationships. "Directly" connected, adjacent, or coupled may refer to a relationship in which there are no intervening components, devices, or structures. "Indirectly" connected, adjacent, or coupled may refer to a relationship in which there are intervening components, devices, or structures.

A bit line pre-charge circuit and method are disclosed. A bit line is pre-charged to a predetermined voltage by the bit line pre-charge circuit. The bit line is pre-charged within a time frame defined by a bit line pre-charge window. The bit line pre-charge window includes a margin for timing variations. Timing variations may occur due to variations in the silicon of a die, as an example. A word line signal is provided by the bit line pre-charge circuit after the bit line pre-charge window closes. However, when the margin is not adequate, the word line signal could be provided before the bit line pre-charge window closes, which could cause signal and/or data errors.

According to some embodiments, when the bit line pre-charge window is within an adequate margin of a predetermined bit line pre-charge window, a bit line pre-charge clock signal is based on an edge of a pulse of a clock signal internal to the bit line pre-charge circuit. When the bit line pre-charge window is outside the margin of the predetermined bit line pre-charge window, the bit line pre-charge clock signal is based on an edge of a pulse of a clock signal external to the bit line pre-charge circuit.

FIG. 1 is an illustration of a bit line pre-charge circuit 100, according to some embodiments. The bit line pre-charge circuit 100 is coupled to an external clock CLK_EX 102 that is external of the bit line pre-charge circuit 100, such as a system clock as an electronic device comprising the bit line pre-charge circuit 100. The external clock CLK_EX 102 generates and outputs a first clock signal CLK at a frequency based upon a frequency signal FRQ supplied by a controller 124. The frequency of the first clock signal CLK is adjustable by the controller 124 using the frequency signal FRQ. In some embodiments, adjusting the frequency of the first clock signal CLK comprises adjusting the frequency of the first clock signal CLK through multiple frequencies, referred to as a frequency sweep. A frequency sweep may begin at a start frequency and end at a stop frequency. The frequency sweep through the multiple frequencies may occur at a specified sweep rate and/or specified frequency step. The frequency sweep may move up or down a frequency band, with either linear or logarithmic spacing. Other techniques to adjust the frequency of the first clock signal CLK are within the scope of the present disclosure.

An output terminal 104 of the external clock CLK_EX 102 is coupled to a first input terminal 106 of a first clock signal generator CLK_G1 108. According to some embodiments, the first clock signal generator CLK_G1 108 receives the first clock signal CLK and generates a second clock signal CKPB_NAP. According to some embodiments, a first edge of a pulse of the first clock signal CLK triggers a first edge of a pulse of the second clock signal CKPB_NAP. A second edge of the pulse of the second clock signal CKPB_NAP may be triggered by a first edge of a pulse of a third clock signal CKPB generated by a second clock signal generator CLK_G2 110. An output terminal 150 of the second clock signal generator CLK_G2 110 is coupled to a second input terminal 152 of the first clock signal generator CLK_G1 108. A pulse width of the pulse of the second clock signal CKPB_NAP is defined as the distance from the first edge of the pulse of the second clock signal CKPB_NAP to the second edge of the pulse of the second clock signal CKPB_NAP. Other configurations of the bit line pre-charge circuit 100 to generate the second clock signal CKPB_NAP are within the scope of the present disclosure.

An output terminal 112 of the first clock signal generator CLK_G1 108 is coupled to an input terminal 114 of a bit line pre-charge signal generator BLPREB 116. According to some embodiments, the bit line pre-charge signal generator BLPREB 116 receives the second clock signal CKPB_NAP and generates a bit line pre-charge signal BLPREB. The bit line pre-charge signal generator BLPREB 116 comprises an output terminal 118 to output the bit line pre-charge signal BLPREB to a memory cell array and/or a memory cell (not shown). According to some embodiments, the first edge of the pulse of the second clock signal CKPB_NAP triggers a first edge of a pulse of the bit line pre-charge signal BLPREB. The second edge of the pulse of the second clock signal CKPB_NAP triggers a second edge of the pulse of the bit line pre-charge signal BLPREB. A pulse width of the pulse of the bit line pre-charge signal BLPREB is defined as the distance from the first edge of the pulse of the bit line pre-charge signal BLPREB to the second edge of the pulse of the bit line pre-charge signal BLPREB. As may be further understood with respect to FIG. 3 and the accompanying text, in some embodiments, the pulse width of the pulse of the bit line pre-charge signal BLPREB is equal to the pulse width of the pulse of the second clock signal CKPB_NAP, but the pulse of the bit line pre-charge signal BLPREB may be time-delayed relative to a pulse of the second clock signal CKPB_NAP. For example, the bit line pre-charge signal generator BLPREB 116 may introduce a time-delay to the second clock signal CKPB_NAP to generate the bit line pre-charge signal BLPREB. In some embodiments, the bit line pre-charge signal generator BLPREB 116 comprises an inverter chain configured to introduce the time-delay, although other circuit elements for introducing a time-delay are contemplated. Other configurations of the bit line pre-charge circuit 100 to generate the bit line pre-charge signal BLPREB are within the scope of the present disclosure.

A tracking circuit 120 comprises an input terminal 122 coupled to the output terminal 112 of the first clock signal generator CLK_G1 108. According to some embodiments, the tracking circuit 120 receives the second clock signal CKPB_NAP and determines whether the pulse width of the second clock signal CKPB_NAP is within a margin of a predetermined bit line pre-charge window and communicates the determination to the controller 124. In some embodiments, the tracking circuit 120 further passes the second clock signal CKPB_NAP to an output terminal 138 of the tracking circuit 120 or passes a time-delayed version of the second clock signal CKPB_NAP to the output terminal 138 of the tracking circuit 120.

The controller 124 comprises a first output terminal 126 and a second output terminal 128. The controller 124 outputs a first switch control signal TMPT to the first output terminal 126 and outputs the frequency signal FRQ to the second output terminal 128. The first output terminal 126 is coupled to an inverter 130 and to a switch circuit 132. The first output terminal 126 conveys the first switch control signal TMPT to the switch circuit 132 and to the inverter 130. The inverter 130 inverts the first switch control signal TMPT to generate a second switch control signal TMPTB. The switch circuit 132 receives the first switch control signal TMPT and the second switch control signal TMPTB. The first switch control signal TMPT and the second switch control signal TMPTB control a state of the switch circuit 132. According to some embodiments, when the first switch control signal TMPT is at a first state (e.g., logic 0) and the second switch control signal TMPTB is at a second state (e.g., logic 1), a first switch 134 of the switch circuit 132 is closed and a second switch 136 of the switch circuit 132 is open. According to some embodiments, when the first switch control signal TMPT is at the second state (e.g., logic 1) and the second switch control signal TMPTB is at the first state (e.g., logic 0), the first switch 134 of the switch circuit 132 is open and the second switch 136 of the switch circuit 132 is closed. Other configurations of the controller 124 and the switch circuit 132 are within the scope of the present disclosure.

If the first switch 134 of the switch circuit 132 is closed and the second switch 136 is open, an output terminal 138 of the tracking circuit 120 is coupled through the switch circuit 132 and an output terminal 141 of the switch circuit 132 to an input terminal 140 of the second clock signal generator CLK_G2 110. In this state of the switch circuit 132, the second clock signal CKPB_NAP is communicated as CLKB_NAP_IN signal to the input terminal 140 of the second clock signal generator CLK_G2 110.

If the first switch 134 of the switch circuit 132 is open and the second switch 136 is closed, the output terminal 104 of the external clock CLK_EX 102 is coupled through the switch circuit 132 and the output terminal 141 of the switch circuit 132 to the input terminal 140 of the second clock signal generator CLK_G2 110. In this state of the switch circuit 132, the first clock signal CLK is communicated as the CLKB_NAP_IN signal to the input terminal 140 of the second clock signal generator CLK_G2 110. Other configurations of the switch circuit 132 are within the scope of the present disclosure.

Referring to the tracking circuit 120 and the controller 124, when the pulse width of the pulse of the second clock signal CKPB_NAP is within the margin of the predetermined bit line pre-charge window, the controller 124 sets the state of the first switch control signal TMPT to the first state (e.g., logic 0). As will be further described with respect to FIGS. 2 and 3, when the first switch control signal TMPT is in the first state, the bit line pre-charge circuit 100 is in an internal clock state. In the internal clock state, the second clock signal CKPB_NAP is communicated as the CLKB_NAP_IN signal to the input terminal 140 of the second clock signal generator CLK_G2 110, and the first edge of the pulse of the second clock signal CKPB_NAP (communicated as CLKB_NAP_IN) triggers the first edge of the pulse of the third clock signal CKPB.

If the pulse width of the pulse of the second clock signal CKPB_NAP is outside the margin of the predetermined bit line pre-charge window, the controller 124 sets the state of the first switch control signal TMPT to the second state (e.g., logic 1). As will be described further with respect to FIGS. 4 and 5, when the first switch control signal TMPT is in the second state (e.g., logic 1), and the bit line pre-charge circuit 100 is in an external clock state. In the external clock state, the first clock signal CLK is communicated as the CLKB_NAP_IN signal to the input terminal 140 of the second clock signal generator CLK_G2 110, and a second edge of the pulse of the first clock signal CLK (communicated as CLKB_NAP_IN) triggers the first edge of the pulse of the third clock signal CKPB. Thus, the first edge of the pulse of the third clock signal CKPB is triggered by the second clock signal CKPB_NAP when the bit line pre-charge circuit 100 is in the internal clock state and is triggered by the first clock signal CLK when the bit line pre-charge circuit 100 is in an external clock state.

In both the internal clock state and the external clock state, the first edge of the pulse of the third clock signal CKPB triggers the second edge of the pulse of the second clock signal CKPB_NAP, the first edge of the pulse of the second clock signal CKPB_NAP triggers the first edge of the pulse of the bit line pre-charge signal BLPREB, and the second edge of the pulse of the second clock signal CKPB_NAP triggers the second edge of the pulse of the bit line pre-charge signal BLPREB. The second edge of the pulse of the bit line pre-charge signal BLPREB closes the bit line pre-charge window.

If the pulse width of the second clock signal CKPB_NAP is within the margin of the predetermined bit line pre-charge window, the bit line pre-charge circuit 100 is in the internal clock state. In the internal clock state, the first edge of the pulse of the second clock signal CKPB_NAP triggers the first edge of the pulse of the third clock signal CKPB, which in turn triggers the second edge of the pulse of the second clock signal CKPB_NAP, which in turn triggers the second edge of the pulse of the bit line pre-charge signal BLPREB and closes the bit line pre-charge window. When the pulse width of the second clock signal CKPB_NAP is outside the margin of the predetermined bit line pre-charge window, the bit line pre-charge circuit 100 is in the external clock state and the second edge of the pulse of the first clock signal CLK triggers the first edge of the pulse of the third clock signal CKPB, which in turn triggers the second edge of the pulse of the second clock signal CKPB_NAP, which in turn triggers the second edge of the pulse of the bit line pre-charge signal BLPREB and closes the bit line pre-charge window.

In the internal clock state, the controller 124 outputs a first frequency signal FRQ to the external clock CLK_EX 102, which fixes the frequency of the first clock signal CLK generated by the external clock CLK_EX 102 at a specified frequency. In the external clock state, the controller 124 outputs a second frequency signal FRQ to the external clock CLK_EX 102. The second frequency signal may cause the external clock CLK_EX 102 to sweep the frequency of the first clock signal CLK through several frequencies. At one or more of the several frequencies, the tracking circuit 120 determines whether the pulse width of the pulse of the second clock signal CKPB_NAP is within the margin of the predetermined bit line pre-charge window and communicates the determination to the controller 124. By way of the sweep the frequency of the first clock signal CLK through several frequencies, the controller 124 may fix the frequency of the first clock signal CLK to a frequency that provides a bit line pre-charge window that is within a margin of the predetermined bit line pre-charge window.

According to some embodiments, the bit line pre-charge circuit 100 comprises a decoder DEC 142 that receives the third clock signal CKPB and outputs a word line signal WL at a second edge of the pulse of the third clock signal CKPB that follows the second edge (i.e., closure of the pre-charge window) of the pulse of the bit line pre-charge signal BLPREB. The word line signal WL is output at a decoder output terminal 144 to activate a row of memory cells in a memory cell array for a memory operation on one or more memory cells of the row.

Figure 2:
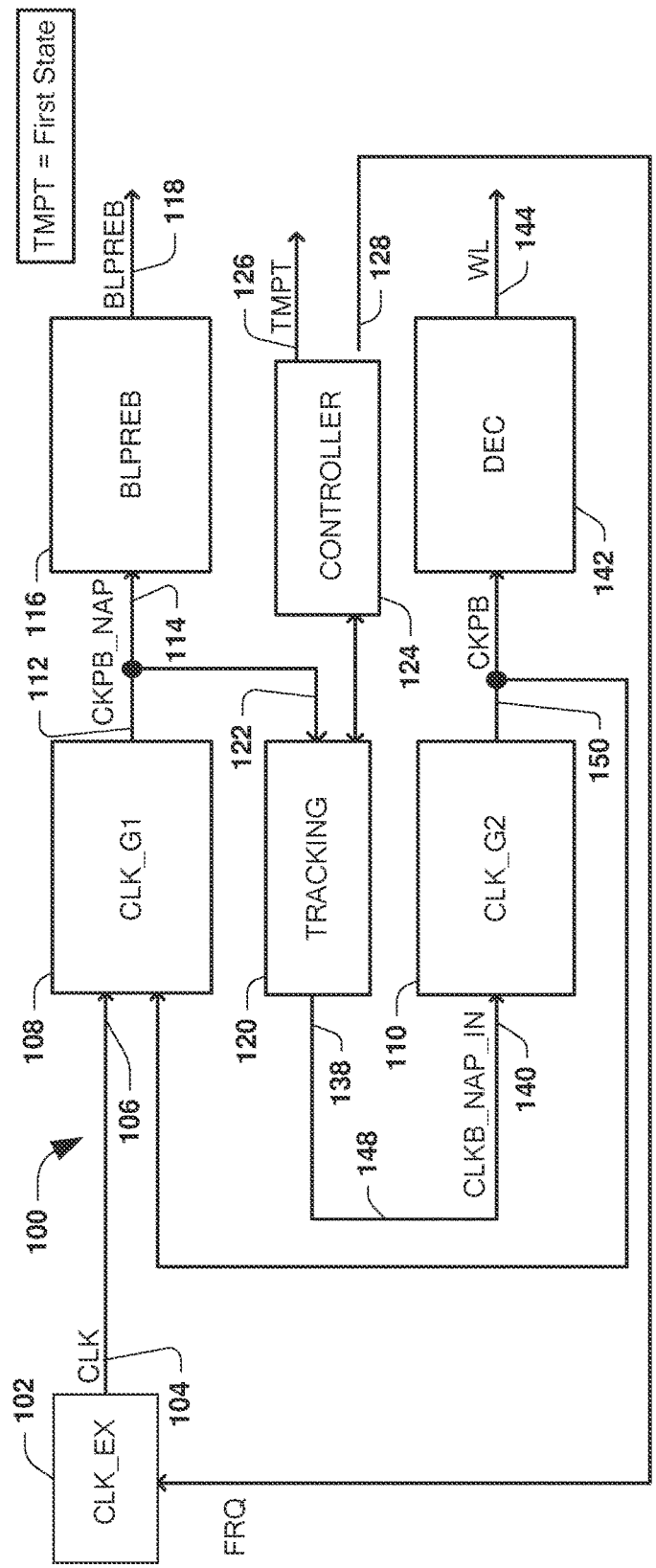
FIG. 2 is an illustration of a bit line pre-charge circuit, according to some embodiments.
Figure 3:
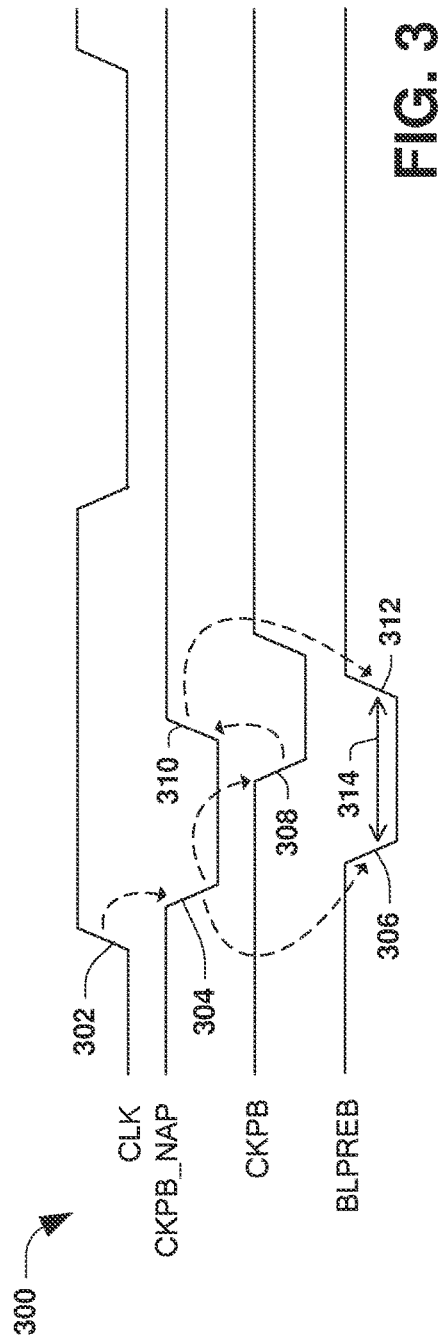
FIG. 3 is a timing diagram of a bit line pre-charge circuit, according to some embodiments.

FIG. 2 is an illustration of the bit line pre-charge circuit 100, according to some embodiments. The functionality of the bit line pre-charge circuit 100 illustrated in FIG. 2 is substantially equivalent to the functionality of the bit line pre-charge circuit 100 of FIG. 1 under the condition that the first switch control signal TMPT is in the first state (e.g., logic 0). In FIG. 2, for clarity of explanation, the switch circuit 132 is not shown but rather is represented by a conductor 148. The output terminal 104 of the external clock CLK_EX 102 is electrically coupled to the first input terminal 106 of the first clock signal generator CLK_G1 108. Because the first switch control signal TMPT is in the first state, the first switch 134 (illustrated in FIG. 1) of the switch circuit 132 is closed and the second switch 136 (illustrated in FIG. 1) of the switch circuit 132 is open. Because the first switch 134 of the switch circuit 132 is closed, the output terminal 138 of the tracking circuit 120 is electrically coupled to the input terminal 140 of the second clock signal generator CLK_G2 110. Because the second switch 136 of the switch circuit 132 is open, the output terminal 104 of the external clock CLK_EX 102 is not electrically coupled to the input terminal 140 of the second clock signal generator CLK_G2 110. FIG. 3 is a timing diagram 300 of the bit line pre-charge circuit 100 illustrated in FIG. 2, according to some embodiments.

Referring to FIG. 2 and FIG. 3, when the first clock signal generator CLK_G1 108 receives a rising edge 302 (i.e., a first edge) of the pulse of the first clock signal CLK, the first clock signal generator CLK_G1 108 generates and outputs at the output terminal 112 a falling edge 304 (i.e., a first edge) of the pulse of the second clock signal CKPB_NAP. The falling edge 304 of the pulse of the second clock signal CKPB_NAP is received by the bit line pre-charge signal generator BLPREB 116 and the second clock signal generator CLK_G2 110 (communicated as CLKB_NAP_IN). The bit line pre-charge signal generator BLPREB 116 generates and outputs at the output terminal 118 a falling edge 306 (i.e., a first edge) of the pulse of the bit line pre-charge signal BLPREB. The second clock signal generator CLK_G2 110 generates and outputs at the output terminal 150 a falling edge 308 (i.e., a first edge) of the pulse of the third clock signal CKPB.

The first clock signal generator CLK_G1 108 receives the falling edge 308 of the pulse of the third clock signal CKPB and generates and outputs at the output terminal 112 a rising edge 310 (i.e., a second edge) of the pulse of the second clock signal CKPB_NAP. The bit line pre-charge signal generator BLPREB 116 receives the rising edge 310 of the pulse of the second clock signal CKPB_NAP and generates and outputs at the output terminal 118 a rising edge 312 (i.e., a second edge) of the pulse of the bit line pre-charge signal BLPREB. A distance from the falling edge 306 of the pulse of the bit line pre-charge signal BLPREB to the rising edge 312 of the pulse of the bit line pre-charge signal BLPREB defines a bit line pre-charge window 314 when the first switch control signal TMPT is in the first state.

Figure 4:
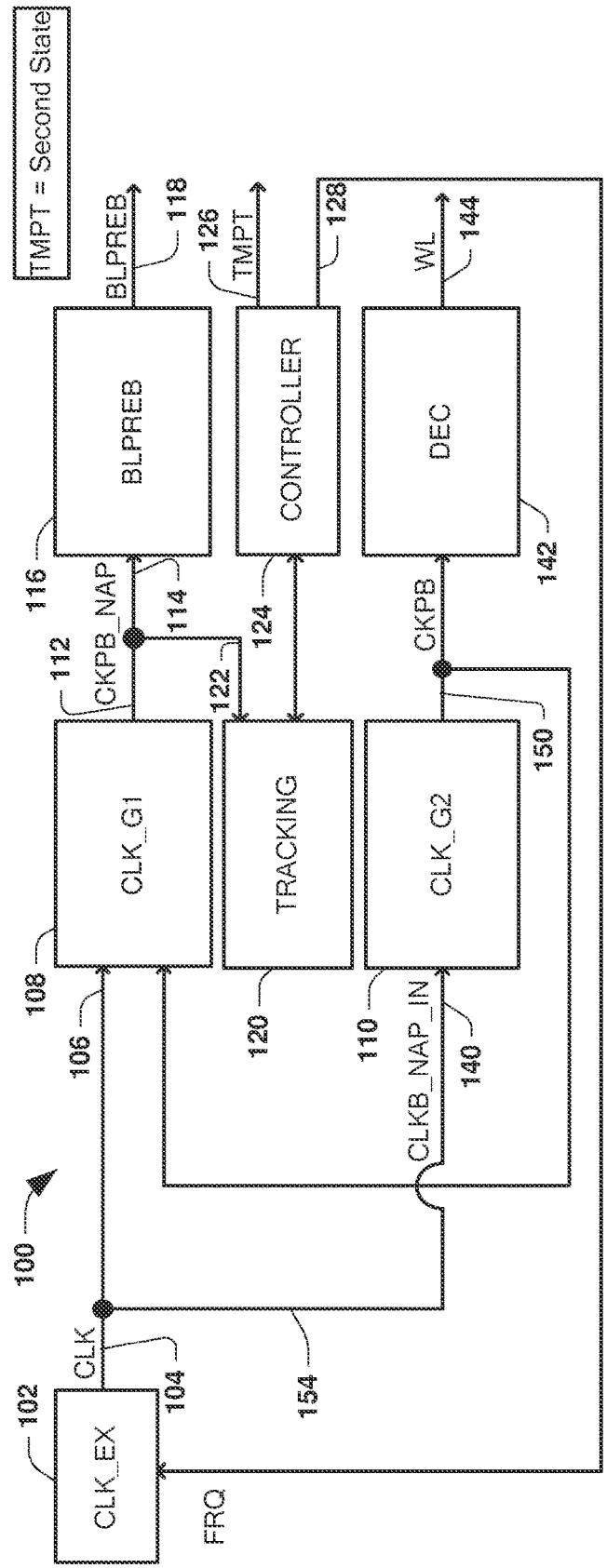
FIG. 4 is an illustration of a bit line pre-charge circuit, according to some embodiments.
Figure 5:
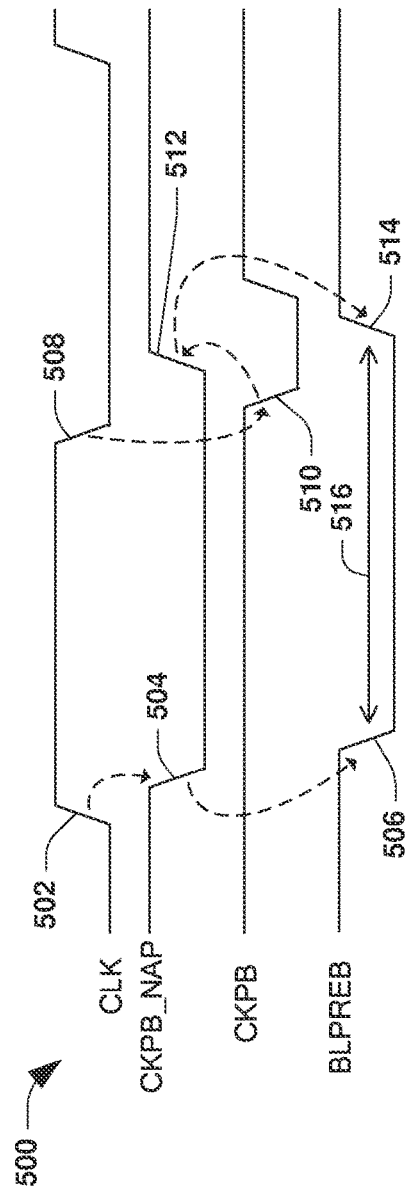
FIG. 5 is a timing diagram of a bit line pre-charge circuit, according to some embodiments.

FIG. 4 is an illustration of the bit line pre-charge circuit 100, according to some embodiments. The functionality of the bit line pre-charge circuit 100 illustrated in FIG. 4 is substantially equivalent to the functionality of the bit line pre-charge circuit 100 of FIG. 1 under the condition that the first switch control signal TMPT is in the second state (e.g., logic 1). In FIG. 4, for clarity of explanation, the switch circuit 132 is not shown but rather is represented by a conductor 154. The output terminal 104 of the external clock CLK_EX 102 is electrically coupled to the first input terminal 106 of the first clock signal generator CLK_G1 108. Because the first switch control signal TMPT is in the second state, the first switch 134 (illustrated in FIG. 1) of the switch circuit 132 is open and the second switch 136 (illustrated in FIG. 1) of the switch circuit 132 is closed. Because the first switch 134 of the switch circuit 132 is open, the output terminal 138 (illustrated in FIG. 1) of the tracking circuit 120 is not is not electrically coupled to the input terminal 140 of the second clock signal generator CLK_G2 110. Because the second switch 136 of the switch circuit 132 is closed, the output terminal 104 of the external clock CLK_EX 102 is electrically coupled to the input terminal 140 of the second clock signal generator CLK_G2 110. FIG. 5 is a timing diagram 500 of the bit line pre-charge circuit 100 illustrated in FIG. 4, according to some embodiments.

Referring to FIG. 4 and FIG. 5, when the first clock signal generator CLK_G1 108 receives a rising edge 502 (i.e., a first edge) of the pulse of the first clock signal CLK, the first clock signal generator CLK_G1 108 generates and outputs at the output terminal 112 a falling edge 504 (i.e., a first edge) of the pulse of the second clock signal CKPB_NAP. The falling edge 504 of the pulse of the second clock signal CKPB_NAP is received by the bit line pre-charge signal generator BLPREB 116. The bit line pre-charge signal generator BLPREB 116 generates and outputs at the output terminal 118 a falling edge 506 (i.e., a first edge) of the pulse of the bit line pre-charge signal BLPREB. When the second clock signal generator CLK_G2 110 receives a falling edge 508 (i.e., a second edge) of the pulse of the first clock signal CLK, the second clock signal generator CLK_G2 110 generates and outputs at the output terminal 150 a falling edge 510 (i.e., a first edge) of the pulse of the third clock signal CKPB.

The first clock signal generator CLK_G1 108 receives the falling edge 510 of the pulse of the third clock signal CKPB and generates and outputs at the output terminal 112 a rising edge 512 (i.e., a second edge) of the pulse of the second clock signal CKPB_NAP. The bit line pre-charge signal generator BLPREB 116 receives the rising edge 512 of the pulse of the second clock signal CKPB_NAP and generates and outputs at the output terminal 118 a rising edge 514 (i.e., a second edge) of the pulse of the bit line pre-charge signal BLPREB. A distance from the falling edge 506 of the pulse of the bit line pre-charge signal BLPREB to the rising edge 514 of the pulse of the bit line pre-charge signal BLPREB defines a bit line pre-charge window 516 when the first switch control signal TMPT is in the second state.

Figure 6:
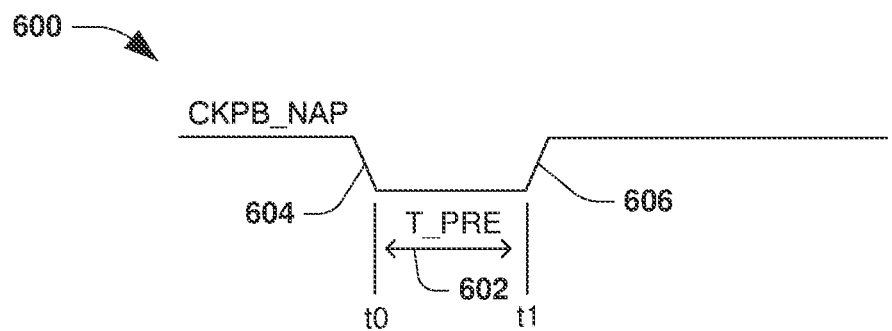
FIG. 6 is an illustration of a waveform of a tracking circuit, according to some embodiments.

FIG. 6 is an illustration of the waveform 600 of the second clock signal CKPB_NAP, according to some embodiments. The second clock signal CKPB_NAP includes a pre-charge window T_PRE 602 from t0 to t1. Because the falling 604 and rising 606 edges of the pulse of the second clock signal CKPB_NAP directly trigger the falling and rising edges of the pulse of the bit line pre-charge signal BLPREB, the duration of the pre-charge window T_PRE 602 from t0 to t1 is substantially equal to the bit line pre-charge window 314 when the first switch control signal TMPT is in the first state, and to the bit line pre-charge window 516 when the first switch control signal TMPT is in the second state. Because the tracking circuit 120 receives the second clock signal CKPB_NAP, the tracking circuit 120 receives the pre-charge window T_PRE 602. Because the tracking circuit 120 receives the pre-charge window T_PRE 602, the tracking circuit 120 readily determines the bit line pre-charge window 314 when the first switch control signal TMPT is in the first state or the bit line pre-charge window 516 when the first switch control signal TMPT is in the second state. According to some embodiments, the duration of the pre-charge window T_PRE 602 is communicated to the controller 124. Responsive to the duration of the pre-charge window T_PRE 602, the controller controls the first switch control signal TMPT to be in the first state when the duration of the pre-charge window T_PRE 602 is within the margin of a predetermined bit line pre-charge window, or controls the first switch control signal TMPT to be in the second state when the duration of the pre-charge window T_PRE 602 is outside the margin of the predetermined bit line pre-charge window.

Figure 7:
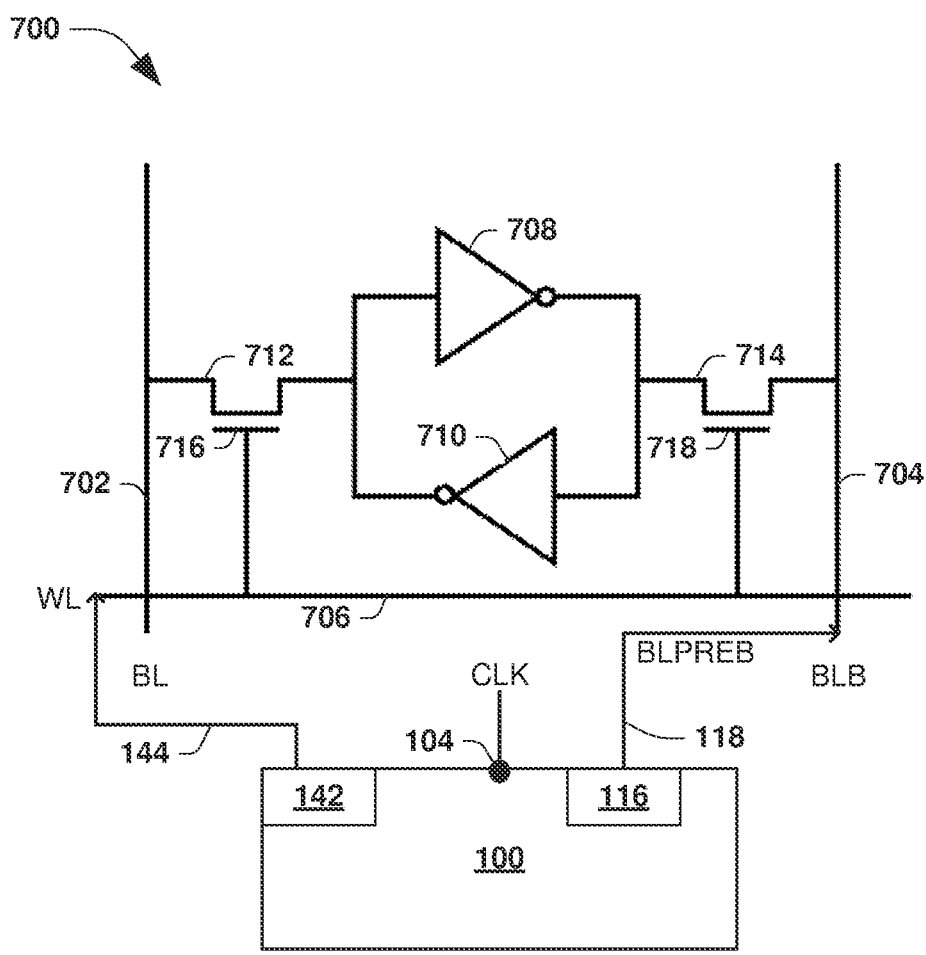
FIG. 7 illustrates a memory cell, according to some embodiments.

FIG. 7 illustrates a memory cell 700, according to some embodiments. The memory cell 700 is coupled to the bit line pre-charge circuit 100. The memory cell 700 is coupled to a bit line BL 702 and an inverted bit line BLB 704, which is set to a level opposite to that of the bit line BL 702. The memory cell 700 is also coupled to a word line WL 706 that is set to a first state (e.g., a high logic level) or a second state (e.g., a low logic level) according to an address signal decoded by the decoder DEC 142. The memory cell 700 comprises a first inverter INV1 708 and a second inverter INV2 710, which are cross-coupled. The memory cell 700 also comprises a first data transfer transistor T1 712 and a second data transfer transistor T2 714 respectively coupled to the bit line BL 702 and to the inverted bit line BLB 704. An output of the first inverter INV1 708 is coupled to second data transfer transistor T2 714, and an output of the second inverter INV2 710 is coupled to the second data transfer transistor T1 712. The word line WL 706 is coupled to a gate 716 of first data transfer transistor T1 712 and to a gate 718 of second data transfer transistor T2 714. When the word line WL 706 is set to the first state, the first data transfer transistor T1 712 and second data transfer transistor T2 714 are closed. When the word line WL 706 is set to the second state, the first data transfer transistor T1 712 and second data transfer transistor T2 714 are open.

According to some embodiments, the decoder output terminal 144 of the decoder DEC 142 is coupled to the word line WL 706, and the output terminal 118 of the bit line pre-charge signal generator BLPREB 116 is coupled to the inverted bit line BLB 704. Other configurations of the memory cell 700 and connections to the bit line pre-charge circuit 100 are within the scope of the present disclosure.

Figure 8:
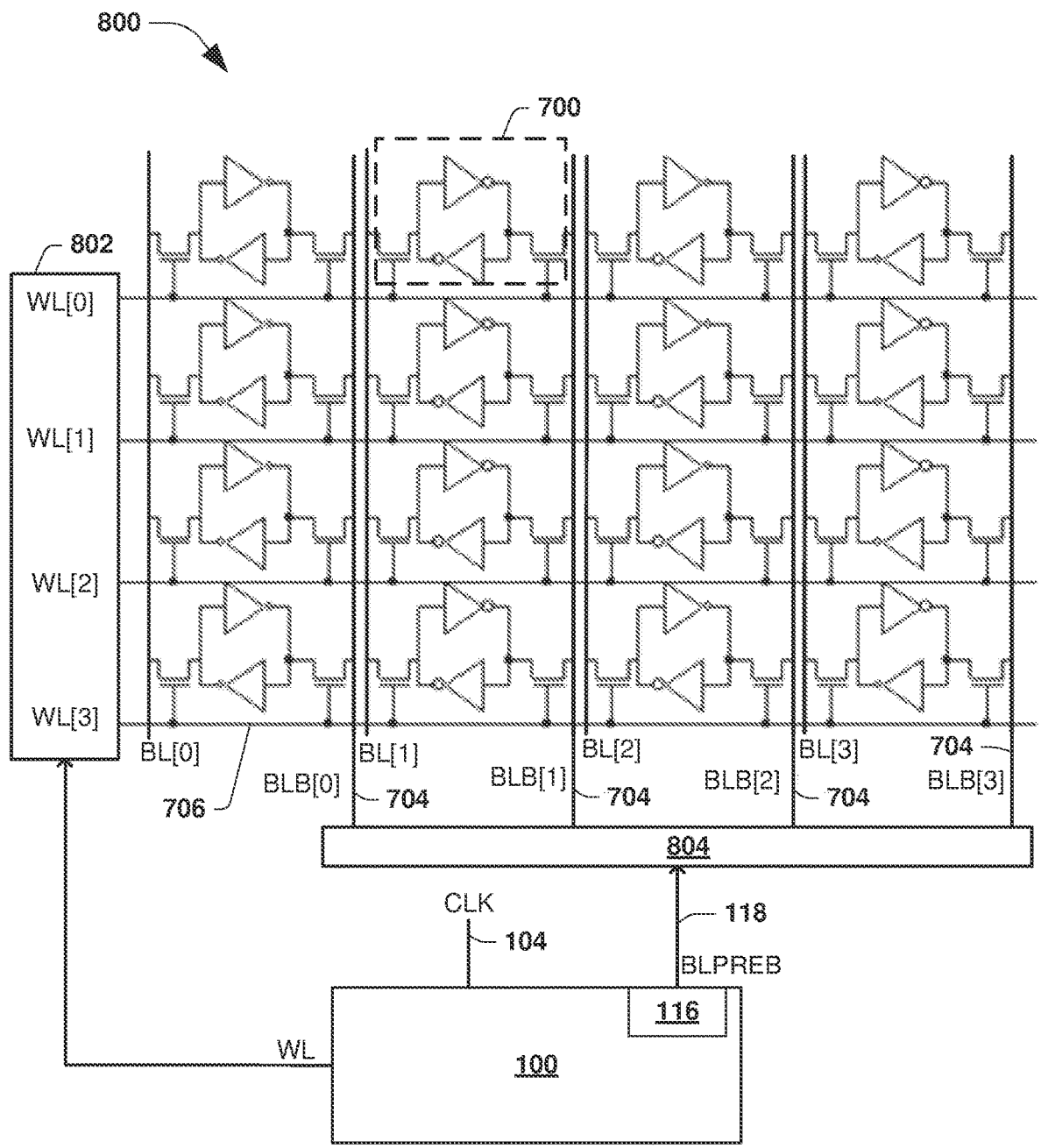
FIG. 8 illustrates a memory cell array, according to some embodiments.

FIG. 8 illustrates a memory cell array 800 comprising rows and columns of the memory cells 700, in which each row is coupled to a different word line WL 706 and each column is coupled to a different bit line BL 702 and inverted bit line BLB 704 according to some embodiments of the present disclosure. The word lines WL 706 of the memory cell array 800 are coupled to a word line address decoder 802 that is external to the bit line pre-charge circuit 100. The inverted bit lines BLB 704 of the memory cell array 800 are coupled to a data line decoder 804. The data line decoder 804 decodes a data address and couples the output terminal 118 of the bit line pre-charge signal generator BLPREB 116 to a corresponding inverted bit line BLB 704. Other configurations of the memory cell array 800 and connections to the bit line pre-charge circuit 100 are within the scope of the present disclosure.

Figure 9:
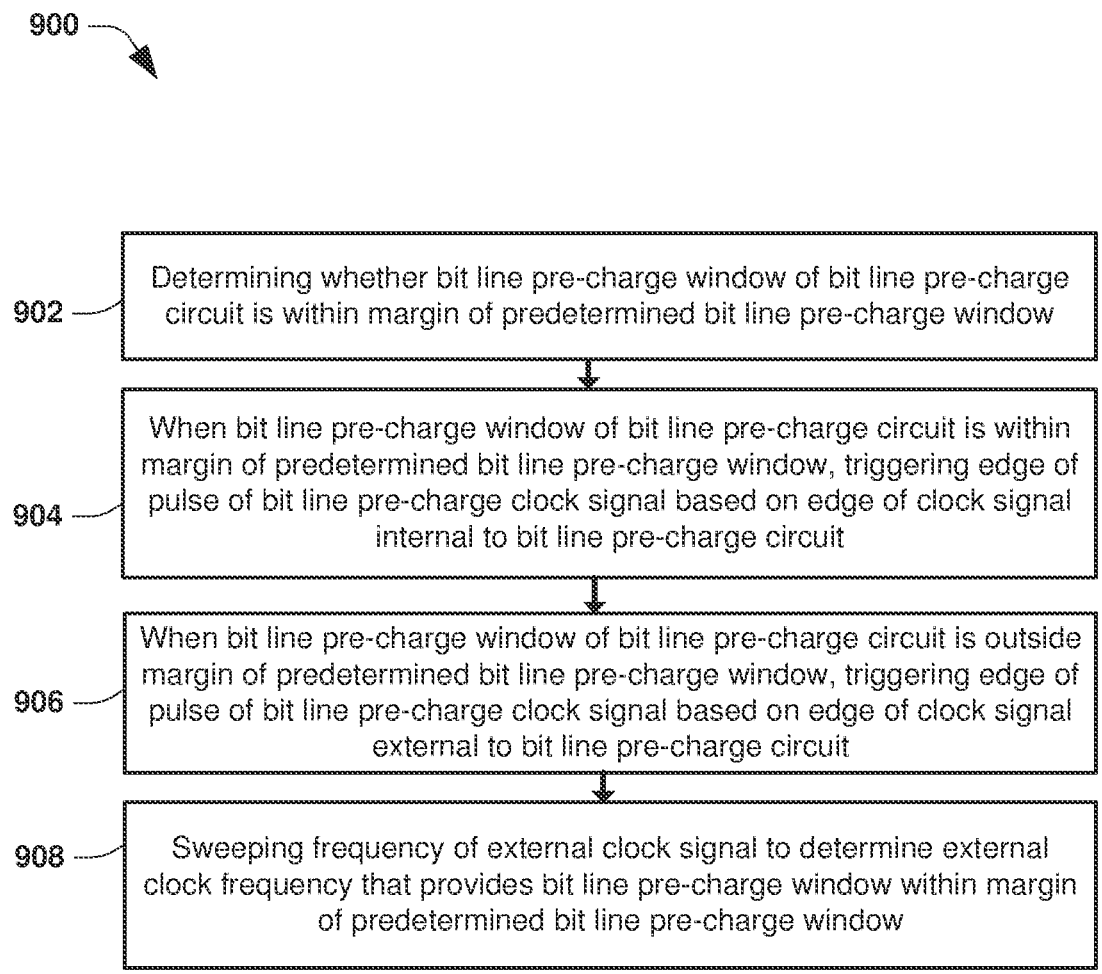
FIG. 9 is an illustration of a method to pre-charge a bit line, according to some embodiments.

FIG. 9 is an illustration of a method 900 to pre-charge a bit line, according to some embodiments. The method 900 comprises determining whether a bit line pre-charge window 314/516 of a bit line pre-charge circuit 100 is within a margin of a predetermined bit line pre-charge window at 902. When the bit line pre-charge window 314/516 of the bit line pre-charge circuit 100 is within the margin of the predetermined bit line pre-charge window, an edge of a pulse of a bit line pre-charge clock signal (e.g., the third clock signal CKPB) is triggered based on an edge of a pulse of a clock signal (e.g., the second clock signal CKPB_NAP) internal to the bit line pre-charge circuit 100 at 904. When the bit line pre-charge window 314/516 of the bit line pre-charge circuit 100 is outside the margin of the predetermined bit line pre-charge window, the edge of the pulse of the bit line pre-charge clock signal (e.g., the third clock signal CKPB) is triggered based on an edge of a pulse of a clock signal (e.g., the first clock signal CLK) external to the bit line pre-charge circuit 100 at 906. When the bit line pre-charge window 314/516 of the bit line pre-charge circuit 100 is outside the margin of the predetermined bit line pre-charge window, sweeping the frequency of the external clock signal (e.g., the first clock signal CLK) determines an external clock frequency that provides a bit line pre-charge window 314/516 that is within a margin of a predetermined bit line pre-charge window at 908. Other and/or additional acts of the method 900 are within the scope of the present disclosure.

Figure 10:
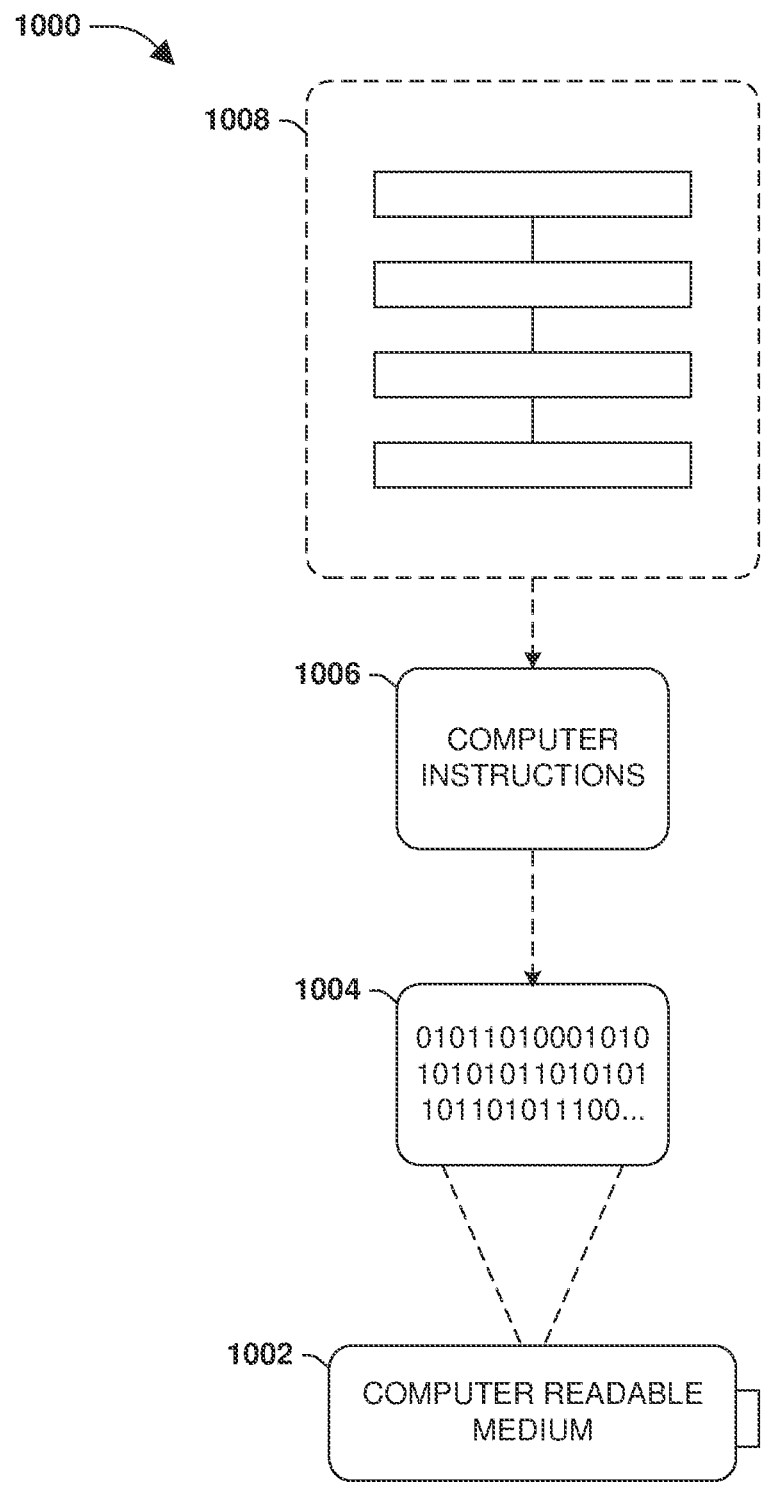
FIG. 10 is an illustration of an exemplary computer-readable medium, according to some embodiments.

FIG. 10 illustrates an exemplary computer-readable medium, according to some embodiments. One or more embodiments involve a computer-readable medium comprising processor-executable instructions configured to implement one or more of the techniques presented herein. An exemplary computer-readable medium is illustrated in FIG. 10, wherein the embodiment 1000 comprises a computer-readable medium 1002 (e.g., a CD-R, DVD-R, flash drive, a platter of a hard disk drive, etc.), on which is encoded computer-readable data 1004. This computer-readable data 1004 in turn comprises a set of processor-executable computer instructions 1006 that when executed are configured to facilitate operations according to one or more of the principles set forth herein. In some embodiments 1000, the processor-executable computer instructions 1006 are configured to facilitate performance of a method 1008, such as at least some of the aforementioned method 900. In some embodiments, the processor-executable computer instructions 1006 are configured to facilitate implementation of a system, such as at least some of the one or more aforementioned system(s). Many such computer-readable media may be devised by those of ordinary skill in the art that are configured to operate in accordance with the techniques presented herein.

Figure 11:
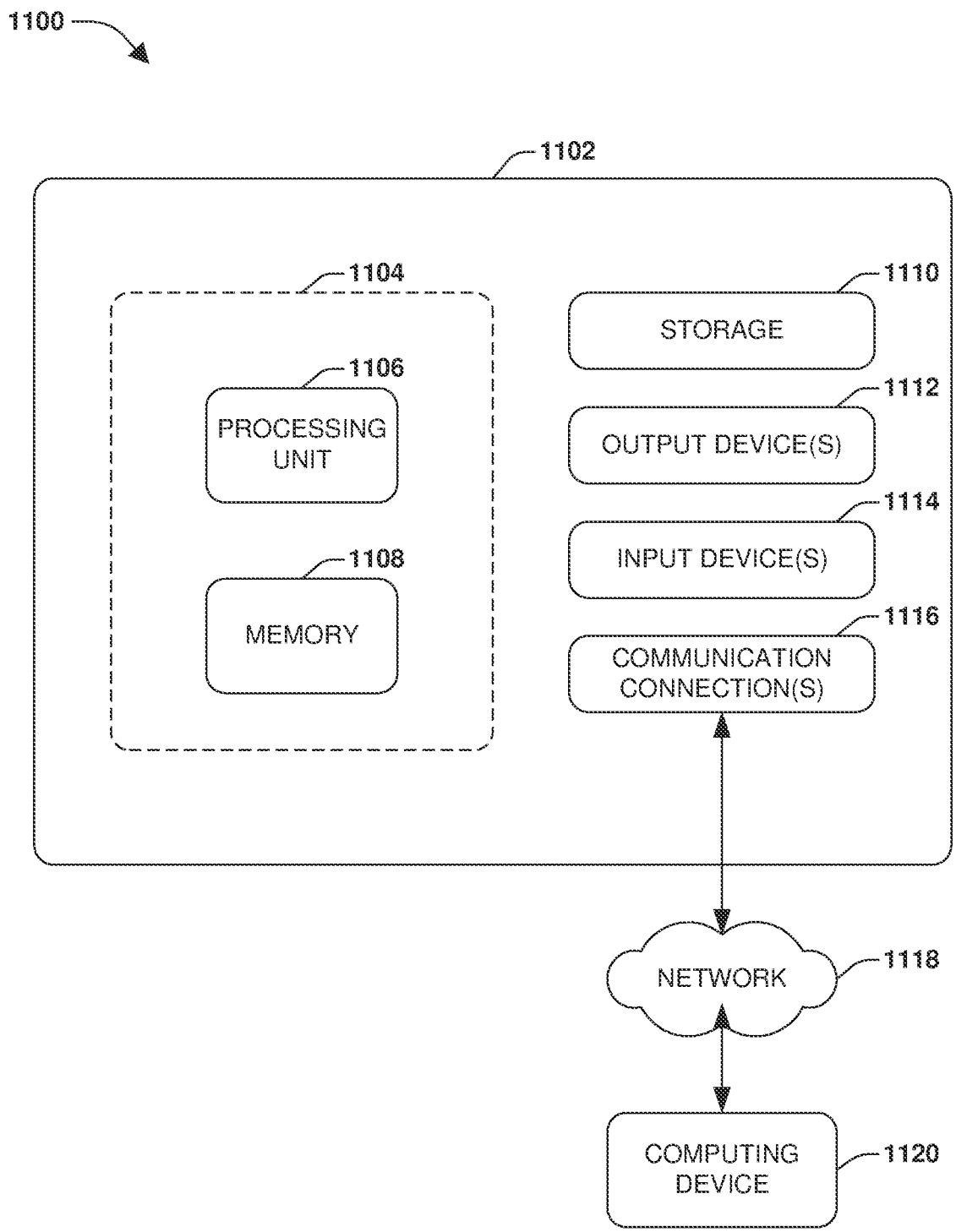
FIG. 11 illustrates an example computing environment wherein one or more of the provisions set forth herein may be implemented, according to some embodiments.

FIG. 11 illustrates an example computing environment wherein one or more of the provisions set forth herein may be implemented, according to some embodiments. FIG. 11 and the following discussion provide a brief, general description of a suitable computing environment to implement embodiments of one or more of the provisions set forth herein. The computing environment of FIG. 11 is only one example of a suitable computing environment and is not intended to suggest any limitation as to the scope of use or functionality of the computing environment. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 11 depicts an example of a system 1100 comprising a computing device 1102 configured as a controller to implement embodiments provided herein. In some configurations, the computing device 1102 includes at least one processing unit 1106 and memory 1108. Depending on the exact configuration and type of computing device, memory 1108 may be volatile (such as random-access memory (RAM), for example), non-volatile (such as read-only memory (ROM), flash memory, etc., for example), or some combination of the two. This configuration is illustrated in FIG. 11 by dashed line 1104.

In some embodiments, the computing device 1102 may include additional features and/or functionality. For example, computing device 1102 may also include additional storage (e.g., removable and/or non-removable) including, but not limited to, magnetic storage, optical storage, and the like. Such additional storage is illustrated in FIG. 11 by storage 1110. In some embodiments, computer readable instructions to implement one or more embodiments provided herein may be in the storage 1110. The storage 1110 may also store other computer readable instructions to implement an operating system, an application program, and the like. Computer readable instructions may be loaded in the memory 1108 for execution by the processing unit 1106, for example.

The term "computer readable media" as used herein includes computer storage media. Computer storage media includes volatile and nonvolatile, removable and non-removable media implemented in any method or technology for storage of information such as computer readable instructions or other data. The memory 1108 and the storage 1110 are examples of computer storage media. Computer storage media includes, but is not limited to, RAM, ROM, electrically erasable programmable read-only memory (EEPROM), flash memory, or other memory technology, CD-ROM, Digital Versatile Disks (DVDs), or other optical storage, magnetic cassettes, magnetic tape, magnetic disk storage, or other magnetic storage devices, or any other medium which can be used to store the desired information and which can be accessed by the computing device 1102. Any such computer storage media may be part of the computing device 1102.

The computing device 1102 may also include communication connection(s) 1116 that allows the computing device 1102 to communicate with other devices. The communication connection(s) 1116 may include, but is not limited to, a modem, a Network Interface Card (NIC), an integrated network interface, a radio frequency transmitter/receiver, an infrared port, a universal serial bus (USB) connection, or other interfaces for connecting the computing device 1102 to other computing devices. The communication connection(s) 1116 may include a wired connection or a wireless connection. The communication connection(s) 1116 may transmit and/or receive communication media.

The term "computer readable media" may include communication media. Communication media typically embodies computer readable instructions or other data in a "modulated data signal" such as a carrier wave or other transport mechanism and includes any information delivery media. The term "modulated data signal" may include a signal that has one or more of its characteristics set or changed in such a manner as to encode information in the signal.

The computing device 1102 may include input device(s) 1114 such as keyboard, mouse, pen, voice input device, touch input device, infrared cameras, video input devices, and/or any other input device. Output device(s) 1112 such as one or more displays, speakers, printers, and/or any other output device may also be included in the computing device 1102. The input device(s) 1114 and the output device(s) 1112 may be connected to the computing device 1102 via a wired connection, wireless connection, or any combination thereof. In some embodiments, an input device or an output device from another computing device may be used as the input device(s) 1114 or the output device(s) 1112 for the computing device 1102.

Components of the computing device 1102 may be connected by various interconnects, such as a bus. Such interconnects may include a Peripheral Component Interconnect (PCI), such as PCI Express, USB, firewire (IEEE 1394), an optical bus structure, and the like. In some embodiments, components of the computing device 1102 may be interconnected by a network. For example, the memory 1108 may be comprised of multiple physical memory units located in different physical locations interconnected by a network.

Those skilled in the art will realize that storage devices utilized to store computer readable instructions may be distributed across a network. For example, a second computing device 1120 accessible via a network 1118 may store computer readable instructions to implement one or more embodiments provided herein. The computing device 1102 may access the second computing device 1120 and download a part or all of the computer readable instructions for execution. Alternatively, the computing device 1102 may download pieces of the computer readable instructions, as needed, or some instructions may be executed at the computing device 1102 and some at the second computing device 1120.

As disclosed, the bit line pre-charge signal generator BLPREB 116 comprises an output terminal 118. The output terminal 118 is coupled to a bit line (e.g., the bit line BL 702 or inverted bit line BLB 704) of the memory cell array 800. The bit line is pre-charged to the predetermined voltage by the bit line pre-charge circuit 100. The bit line is pre-charged within the time frame defined by the bit line pre-charge window 314/516. The bit line pre-charge window 314/516 includes a margin for timing variations. The word line signal WL is provided by the bit line pre-charge circuit 100 after the bit line pre-charge window 314/516 closes. When the bit line pre-charge window 314/516 is within an adequate margin of a predetermined bit line pre-charge window, the bit line pre-charge clock signal is based on an edge of a pulse of the clock signal CKPB_NAP internal to the bit line pre-charge circuit. When the bit line pre-charge window 314/516 is outside the margin of the predetermined bit line pre-charge window, the bit line pre-charge clock signal is based on an edge of a pulse of a clock signal CLK external to the bit line pre-charge circuit 100.

According to some embodiments, a bit line pre-charge circuit includes a bit line pre-charge signal generator, a first clock signal generator coupled to the bit line pre-charge signal generator and including an output terminal, a second clock signal generator coupled to the first clock signal generator and including an input terminal, and a switch circuit including an output terminal coupled to the input terminal of the second clock signal generator. The first clock signal generator is coupled to the switch circuit. When the switch circuit is in a first state, the input terminal of the second clock signal generator is electrically coupled to an external clock, external to the bit line pre-charge circuit. When the switch circuit is in a second state, the output terminal of the first clock signal generator is coupled to the input terminal of the second clock signal generator.

According to some embodiments, a bit line pre-charge circuit includes a bit line pre-charge signal generator including an input terminal, a first clock signal generator including an input terminal and an output terminal, a second clock signal generator including an input terminal, and a switch circuit including an output terminal. The input terminal of the bit line pre-charge signal generator is electrically coupled to the output terminal of the first clock signal generator and to the input terminal of the second clock signal generator, the output terminal of the switch circuit is electrically coupled to the input terminal of the second clock signal generator, and the input terminal of the first clock signal generator is electrically coupled to an output terminal of an external clock external to the bit line pre-charge circuit.

According to some embodiments, a method to pre-charge a bit line includes determining whether a bit line pre-charge window of a bit line pre-charge circuit is within a margin of a predetermined bit line pre-charge window, when the bit line pre-charge window of the bit line pre-charge circuit is within the margin of the predetermined bit line pre-charge window, triggering an edge of a pulse of a bit line pre-charge clock signal based on an edge of a pulse of a clock signal internal to the bit line pre-charge circuit, and when the bit line pre-charge window of the bit line pre-charge circuit is outside the margin of the predetermined bit line pre-charge window, triggering the edge of the pulse of the bit line pre-charge clock signal based on an edge of a pulse of a clock signal external to the bit line pre-charge circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as CVD, for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally to be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method, comprising:
   when a switch circuit is in a first state, coupling an input terminal of a first clock signal generator to an external clock through the switch circuit and supplying an external clock signal generated by the external clock to the first clock signal generator and a second clock signal generator; and
   when the switch circuit is in a second state, coupling an output terminal of the second clock signal generator to the input terminal of first clock signal generator while continuing to supply the external clock signal to the second clock signal generator.

2. The method of claim 1, wherein coupling the output terminal of the second clock signal generator to the input terminal of first clock signal generator comprises:
   coupling the output terminal of the second clock signal generator to the input terminal of first clock signal generator through a tracking circuit.

3. The method of claim 2, wherein:
   a first clock signal is output at the output terminal of the second clock signal generator, and
   the tracking circuit delays the first clock signal such that a time-delayed version of the first clock signal is supplied to the input terminal of first clock signal generator when the switch circuit is in the second state.

4. The method of claim 1, wherein:
   a first clock signal is output at the output terminal of the second clock signal generator, and
   the first clock signal is output to a bit line pre-charge signal generator configured to generate a bit line pre-charge signal based on the first clock signal.

5. The method of claim 4, wherein a pulse width of the bit line pre-charge signal is equal to a pulse width of the first clock signal.

6. The method of claim 1, wherein:
   a first clock signal is output at the output terminal of the second clock signal generator, and
   the method comprises:
     controlling the switch circuit to be in the first state when a pulse width of the first clock signal is outside a margin of a predetermined bit line pre-charge window.

7. The method of claim 6, comprising:
   controlling the external clock to perform a frequency sweep to vary a frequency of the external clock signal when the first clock signal is outside the margin of the predetermined bit line pre-charge window.

8. The method of claim 6, comprising:
   controlling the switch circuit to be in the second state when the pulse width of the first clock signal is within the margin of the predetermined bit line pre-charge window.

9. The method of claim 8, comprising:
   controlling the external clock to maintain a frequency of the external clock signal at a fixed frequency when the first clock signal is within the margin of the predetermined bit line pre-charge window.

10. The method of claim 9, comprising:
    controlling the external clock to perform a frequency sweep to vary the frequency of the external clock signal when the first clock signal is outside the margin of the predetermined bit line pre-charge window.

11. The method of claim 1, wherein:
    a first clock signal is output at the output terminal of the second clock signal generator,
    a timing of a first edge of a pulse of the first clock signal is a function of a second edge of the pulse of the first clock signal when the switch circuit is in the second state, and the timing of the first edge of the pulse of the first clock signal is a function of an edge of a pulse of the external clock signal when the switch circuit is in the first state.

12. A bit line pre-charge circuit, comprising:
a first clock signal generator comprising an output terminal;
a second clock signal generator coupled to the first clock signal generator and comprising an input terminal; and
a switch circuit comprising an output terminal coupled to the input terminal of the second clock signal generator, wherein:
when the switch circuit is in a first state, the input terminal of the second clock signal generator is coupled to an external clock through the switch circuit, and
when the switch circuit is in a second state, the output terminal of the first clock signal generator is coupled to the input terminal of the second clock signal generator through the switch circuit.

13. The bit line pre-charge circuit of claim 12, comprising:
a tracking circuit disposed between the output terminal of the first clock signal generator and the input terminal of the second clock signal generator.

14. The bit line pre-charge circuit of claim 13, wherein the tracking circuit determines whether a pulse width of a first clock signal generated by the first clock signal generator is within a margin of a predetermined bit line pre-charge window to yield a determination.

15. The bit line pre-charge circuit of claim 14, comprising:
a controller configured to receive the determination from the tracking circuit and to place the switch circuit in the first state or the second state based upon the determination.

16. The bit line pre-charge circuit of claim 15, wherein:
the controller places the switch circuit in the first state when the pulse width of the first clock signal is outside the margin of the predetermined bit line pre-charge window, and
the controller places the switch circuit in the second state when the pulse width of the first clock signal is within the margin of the predetermined bit line pre-charge window.

17. The bit line pre-charge circuit of claim 12, wherein an output terminal of the second clock signal generator is coupled to an input terminal of the first clock signal generator.

18. A bit line pre-charge circuit, comprising:
a first clock signal generator configured to output a first clock signal, and
a switch circuit comprising an output terminal configured to output the first clock signal when the switch circuit is in a first state or an external clock signal generated by an external clock when the switch circuit is in a second state, wherein:
a timing of a first edge of a pulse of the first clock signal is a function of a second edge of the pulse of the first clock signal when the switch circuit is in the first state, and
the timing of the first edge of the pulse of the first clock signal is a function of an edge of a pulse of the external clock signal when the switch circuit is in the second state.

19. The bit line pre-charge circuit of claim 18, comprising:
a controller configured to place the switch circuit in the first state or in the second state as a function of a pulse width of the first clock signal.

20. The bit line pre-charge circuit of claim 18, comprising:
a second clock signal generator comprising an output terminal coupled to an input terminal of the first clock signal.

* * * * *